United States Patent [19]

Robin, Jr.

[11] Patent Number: 4,992,683

[45] Date of Patent: Feb. 12, 1991

[54] LOAD DRIVER WITH REDUCED DISSIPATION UNDER REVERSE-BATTERY CONDITIONS

[75] Inventor: Joseph F. Robin, Jr., Fox River Grove, Ill.

[73] Assignee: Motorola, Inc., Schaumburg, Ill.

[21] Appl. No.: 413,933

[22] Filed: Sep. 28, 1989

[51] Int. Cl.$^5$ .................... H03K 17/10; H03K 17/16; H03K 17/687; H03K 3/013
[52] U.S. Cl. .................................. 307/570; 307/571; 307/584; 307/270; 307/127
[58] Field of Search ............... 307/571, 246, 270, 570, 307/584, 127; 323/289

[56] References Cited

U.S. PATENT DOCUMENTS 4,649,302  3/1987  Damiano et al. ................. 307/311

OTHER PUBLICATIONS

"Energy-Saving RAM-Power Tap" in NASSA Tech Briefs, Sep. 1987, p. 21.

Primary Examiner—Stanley D. Miller
Assistant Examiner—Nam T. Nguyen
Attorney, Agent, or Firm—John H. Moore

[57] ABSTRACT

A relay-less load driver circuit includes an FET that couples a battery to a load. A bias circuit that selectively turns the FET on during normal operation also turns the FET on in reverse-battery conditions to avoid high power dissipation by an intrinsic diode associated with the FET.

5 Claims, 1 Drawing Sheet

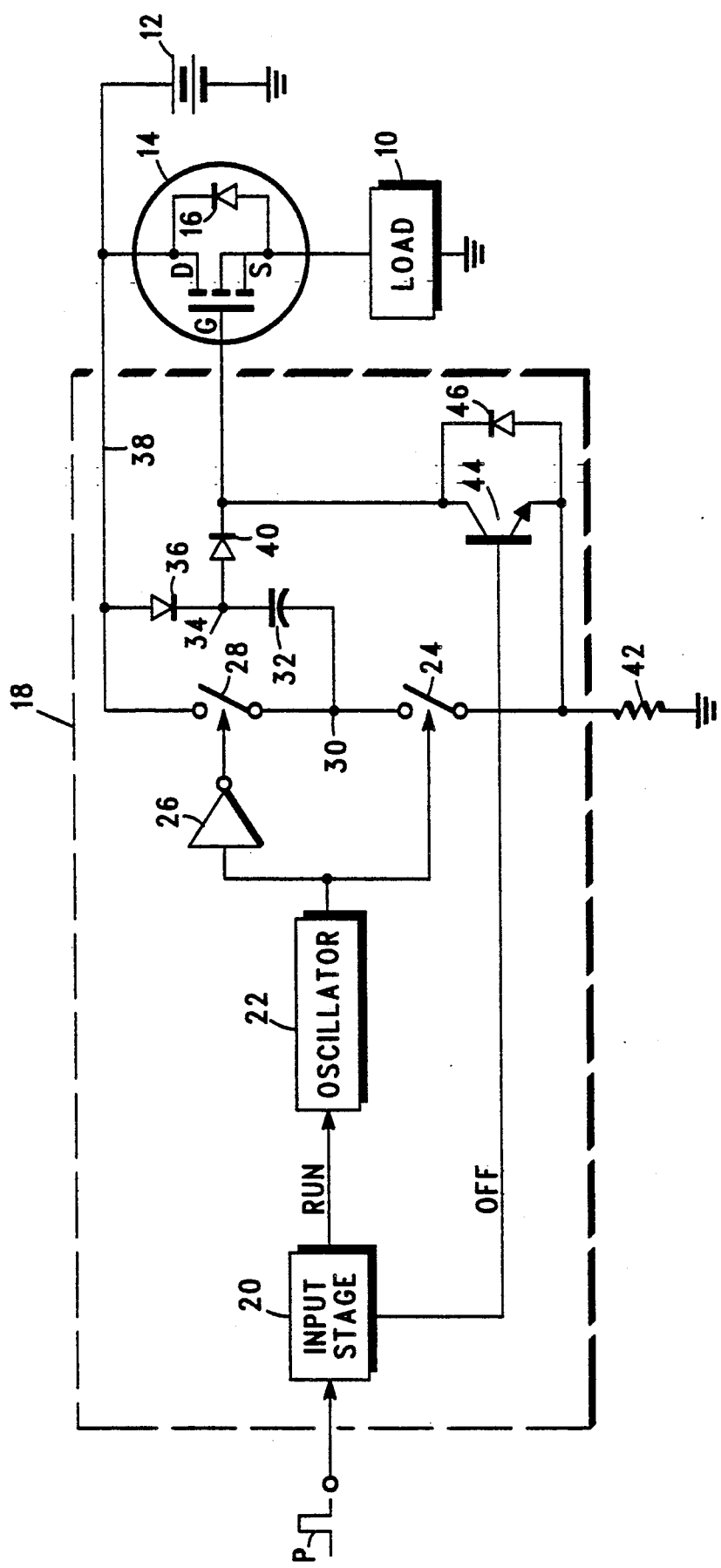

LOAD DRIVER WITH REDUCED DISSIPATION UNDER REVERSE-BATTERY CONDITIONS

FIELD OF THE INVENTION

This invention is directed toward electronic driver circuits for loads that are powered from a battery.

BACKGROUND OF THE INVENTION

Many battery-powered load drivers, such as the drivers found in automotive vehicles, must be designed so that when the battery is mistakenly connected with reverse polarity (i.e., connected with a polarity that is opposite to the normal, intended polarity), the load driver does not malfunction or dissipate high levels of power. Some such drivers that use mechanical switches and relays are easily able to meed this criteria, but drivers that use semiconductor devices in place of their mechanical counterparts can be more difficult to protect. In some cases, it may be necessary to include a relatively large heat sink to carry away the heat generated by a semiconductor device when a reverse-battery condition exists. Of course, since it is desirable to minimize the cost, complexity and size of such electronic load drivers, the use of a large heat sink, or other complicated schemes, is unsatisfactory.

OBJECTS OF THE INVENTION

It is a general object of the invention to provide an improved driver for battery powered loads.

It is a more specific object of the invention to provide a relay-less electronic load driver that has reduced power dissipation under reverse-battery conditions.

BRIEF DESCRIPTION OF THE FIGURE

The sole figure is a schematic diagram of a load driver circuit in accordance with the invention.

DESCRIPTION OF THE PREFERRED EMBODIMENT

Referring to the Figure, the load 10 is shown as being connected in series with a battery 12 via a FET (field-effect transistor) 14. In a preferred arrangement, the drain of the FET 14 is connected to the positive terminal of the battery 12 and the FET's source is connected to the load 10. As shown, the negative terminal of the battery is connected to ground. When an appropriate bias potential is applied to the gate of the FET 14, the FET conducts and acts as a switch to connect the battery to the load 10.

It can be seen that the FET 14 includes an intrinsic diode 16 that is connected between the source and drain of the FET. This intrinsic diode is a diode that is formed as an inherent part of the semiconductor structure that forms the FET itself.

When the battery 12 is connected with its reverse polarity, the positive anode of the battery would be connected to ground and the negative terminal would be connected to the drain of the FET 14. Under this condition, current could flow up through the load 10 and through the diode 16 back to the battery. The FET itself would be off. Typically a current of about 10 amps (depending on the load) could flow through the diode 16, thereby dissipating a higher than desirable level of power and requiring that an extra large heat sink be provided for the FET 14. In contrast, when the battery is connected with its normal polarity and the FET 14 is conducting normally, the voltage drop across the FET is lower, thus dissipating less power.

To avoid the excessive dissipation, a bias means 18, shown in the form of a charge pump that is built as an integrated circuit, is coupled to the gate of the FET 14. The function of this bias means is: (1) to turn on the FET 14 in response to a input signal P that is received by an input stage 20 of the bias means 18, and (2) to respond to the battery being connected with its reverse polarity by holding the FET 14 "on" in an enhanced mode of conduction to provide a relatively low impedance current path between the battery and the load. With the FET 14 conducting heavily during the reverse-battery condition, the current that would otherwise flow through the diode 16 will instead flow through the relatively lower impedance path provided by the FET itself, thereby reducing what would otherwise be a highly undesirable level of power dissipation.

One part of the bias means 18 is a conventional charge pump that operates to develop a bias voltage for the gate of the FET, which bias voltage is greater than the voltage developed by the battery 12. To develop this bias voltage, the input stage 20 develops a "run" signal in response to receipt of the input signal P. It also develops an "off" signal which is at a low level when the signal P is present, and which is at a high level when the signal P is absent.

The "run" signal is coupled to the input of an oscillator 22 which, in response to the "run" signal, develops an output that is coupled to a first switch 24 and, via an inverter 26, to a second switch 28. The function of the oscillator is to open and close the switches 24 and 28 out of phase with each other such that when the switch 24 is closed, the switch 28 is open, and visa versa.

The junction (node 30) between the switches 24 and 28 is coupled via a capacitor 32 to another node 34, the latter being coupled to the battery voltage via a diode 36. A lead 38 couples the positive terminal of the battery 12 to the anode of the diode 36 and also to one side of the switch 28. The node 34 is coupled through another diode 40 to the gate of the FET 14.

Referring again to the switch 24, one side thereof is connected, as shown, to the node 30 and the other side is connected to ground through a resistor 42.

The arrangement discussed above provides an appropriate bias voltage for the gate of the FET which is developed as follows. When the switch 24 is closed, the voltage at the node 30 is held low via the connection to ground through the resistor 42. In that situation, the node 34 is held at a voltage near the battery voltage by means of the diode 36. Therefore, the capacitor 32 charges until it has a potential across it that is substantially equal to the battery voltage. When the switch 28 closes and the switch 24 opens, the voltage at node 30 becomes equal to the battery voltage, thereby forcing the voltage at node 34 to rise to twice the battery voltage. This causes the gate of the FET 14 to charge toward twice the battery voltage through the diode 40, and turns the FET on in an enhancement mode so as to couple the battery 12 to the load 10. Because the gate of the FET 14 acts like a capacitor, it remains charged and holds the FET on until the gate electrode is discharged. In other words, once the FET 14 has been turned on by this arrangement, it stays on until it is intentionally turned off.

The turn-off scheme for the FET includes NPN transistor 44 whose collector is coupled to the gate of the FET and whose base receives the "off" signal from the input stage 20. The emitter of the transistor 44 is coupled to ground through the resistor 42. With this arrangement, the absence of the input signal P causes the input stage 20 to develop a high level "off" signal which turns on the transistor 44, thereby creating a discharge path to ground for the gate electrode of the FET and turning the FET off.

It is known that a bipolar transistor that is constructed as part of an integrated circuit may also include an intrinsic diode. This fact is used to advantage with the present arrangement in order to limit the dissipation in the FET 14 under reverse-battery conditions. As shown, the transistor 44 has an intrinsic diode 46, the anode of which is coupled to the emitter of the transistor 44 and the cathode of which is coupled to the transistor's collector. This arrangement functions to limit the dissipation of the FET under reverse-battery conditions, as will now be described.

In the reverse-battery condition, the positive terminal of the battery 12 becomes connected to ground and the negative terminal becomes connected to the lead 38. Consequently, the diode 46 becomes forward biased and couples a positive bias voltage (approximately equal to the battery voltage) from the battery 12 to the gate of the FET 14. At the same time, the diode 16 holds the source voltage to one diode rise above the voltage on lead 38. This provides a positive gate-to-source potential sufficient to turn the FET on in an enhancement mode, thereby causing the FET to present a relatively low impedance path between the load and the battery so that substantially all the load current now flows through the FET's source to drain path rather than through the diode 16. As a result, dissipation in the FET 14 is reduced substantially. In one instance, dissipation in the FET in a reverse-battery condition was reduced from about 20 watts to about 6.8 watts, thereby allowing for a smaller, less expensive heat sink for the FET and thereby removing any need for more complex circuitry to accomplish a similar result.

It can be seen, therefore, that the illustrated circuit provides a relay-less, electronic load driver that is able to easily handle reverse-battery conditions. Because the power dissipation of the FET 14 can actually be reduced during the reverse-battery condition, there is no need for a relatively large heat sink or for other complex protective schemes.

Although the invention has been described in terms of a preferred embodiment, it will be obvious to those skilled in the art that many alterations and modifications may be made without departing from the invention. Accordingly it is intended that all such modifications and alterations be considered as within the spirit of and scope of the invention as defined by the appended claims.

What is claimed is:

1. In a system which powers a load from a battery in response to an input signal, a load driver circuit that reduces power dissipation when the battery is coupled to the load with reverse polarity, comprising:
   an FET (field-effect transistor) coupled between the load and the battery, the FET having a control electrode; and
   bias means receiving the input signal and coupled to the FET's control electrode for turning the FET on in response to the input signal, and, responsive to the battery being coupled to the load with reverse polarity, for holding the FET on to provide a relatively low impedance current path between the battery and the load.

2. A load driver circuit as set forth in claim 1 wherein said bias means includes:
   first means coupled to the battery for developing a bias voltage that is greater than the battery voltage, second means for coupling the bias voltage to the control electrode of the FET, and third means for coupling the FET's control electrode to a relatively low potential when the FET is to be turned off.

3. A load driver circuit as set forth in claim 2 wherein said third means includes a transistor coupled between the FET's control electrode and ground.

4. A load driver circuit as set forth in claim 3 wherein said third means additionally includes a diode coupled in parallel with the transistor, the diode being poled in a direction to apply a turn-on potential to the FET's control electrode when the battery is connected in circuit with the load in reverse polarity.

5. In a system which powers a load from a battery in response to an input signal, a load driver circuit that reduces power dissipation when the battery is coupled to the load with reverse polarity, comprising
   an FET (field-effect transistor) coupled between the load and the battery, the FET having a control electrode;
   an integrated circuit having means coupled to the FET's control electrode for turning the FET on in response to the input signal, and means, including an intrinsic substrate diode, coupled to the FET's control electrode and responsive to the battery being coupled to the load with reverse polarity, for biasing the FET into an enhancement mode of conduction.

* * * * *